(12) United States Patent
Breen et al.

(10) Patent No.: US 8,027,212 B2
(45) Date of Patent: Sep. 27, 2011

(54) METHOD AND APPARATUS FOR A DYNAMIC SEMICONDUCTOR MEMORY WITH COMPACT SENSE AMPLIFIER CIRCUIT

(76) Inventors: Kristopher Chad Breen, Saskatoon (CA); Duncan George Elliott, Edmonton (CA)

( * ) Notice: Subject to any disclaimer, the term of this patent is extended or adjusted under 35 U.S.C. 154(b) by 123 days.

(21) Appl. No.: 11/730,406

(22) Filed: Apr. 2, 2007

(65) Prior Publication Data

US 2008/0219072 A1    Sep. 11, 2008

Related U.S. Application Data

(60) Provisional application No. 60/787,509, filed on Mar. 31, 2006.

(51) Int. Cl.
*G11C 7/00* (2006.01)
(52) U.S. Cl. .................. 365/203; 365/72; 365/196
(58) Field of Classification Search .......... 365/203, 365/72, 196
See application file for complete search history.

(56) References Cited

U.S. PATENT DOCUMENTS

| | | | |
|---|---|---|---|
| 3,387,286 A | 6/1968 | Dennard | |
| 4,045,783 A | 8/1977 | Harland | |
| 5,920,514 A * | 7/1999 | Lim et al. | 365/200 |
| 5,991,209 A * | 11/1999 | Chow | 365/189.05 |
| 6,829,682 B2 | 1/2004 | Kirihata | |
| 2007/0025170 A1* | 2/2007 | Barth et al. | 365/208 |

OTHER PUBLICATIONS

Karl Stein et al., Storage array and sense / refresh circuit for single-transistor memory cells, IEEE Journal of Solid-State Circuits, SC-7(5):336-340, Oct. 1972.
W. M. Regitz and J. A. Karp, Three-transistor-cell 1024-bit 500-ns MOS RAM, IEEE Journal of Solid-State Circuits, SC-5(5):181-186, Oct. 1970.
An experimental DRAM with a NAND-structured cell, IEEE Journal of Solid-State Circuits, 28(11):1099-1104, Nov. 1993.
M. Redeker, B. F. Cockburn, and D. G. Elliott. An investigation into crosstalk noise in DRAM structures, in Proceedings of the 2002 IEEE International Workshop on Memory Technology, Design and Testing, pp. 123-129, Jul. 2002.
T. Takahashi et al., A multigigabit DRAM technology with 6F2 open-bitline cell, distributed overdriven sensing, and stacked-flash fuse, IEEE Journal of Solid-State Circuits, 36(11):1721-1727, Nov. 2001.
In B. Keeth and R.J. Baker, DRAM Circuit Design: A Tutorial, IEEE Press, Piscataway, NJ, 2001.

\* cited by examiner

*Primary Examiner* — Ly D Pham

(57) ABSTRACT

A high-density dynamic memory device with compact sense amplifier circuit is described. The memory device achieves high density through the use of a compact sense amplifier circuit that employs a single transistor to sense stored dynamic data. Functionality of the device is enabled by an architecture and method of operation that support a compact sense amplifier circuit. Enabling techniques include sequential sensing of memory columns, a two-pass write operation, a two-step refresh operation, a reference scheme that uses reference data stored in regular memory cells, and the application of digital signal processing to determine sensed data and cancel crosstalk noise.

2 Claims, 13 Drawing Sheets

$$C = \begin{bmatrix} 0.0016 & 0.008 & 0.04 & 0.2 & 1 \\ 0.008 & 0.04 & 0.2 & 1 & 0.2 \\ 0.04 & 0.2 & 1 & 0.2 & 0.04 \\ 0.2 & 1 & 0.2 & 0.04 & 0.008 \\ 1 & 0.2 & 0.04 & 0.008 & 0.0016 \end{bmatrix}$$

FIG. 12A $$C^{-1} = \begin{bmatrix} 0.0000 & 0.0000 & 0.0000 & -0.2083 & 1.0417 \\ 0.0000 & 0.0000 & -0.2083 & 1.0833 & -0.2083 \\ 0.0000 & -0.2083 & 1.0833 & -0.2083 & 0.0000 \\ -0.2083 & 1.0833 & -0.2083 & 0.0000 & 0.0000 \\ 1.0417 & -0.2083 & 0.0000 & 0.0000 & 0.0000 \end{bmatrix}$$

FIG. 12B

METHOD AND APPARATUS FOR A DYNAMIC SEMICONDUCTOR MEMORY WITH COMPACT SENSE AMPLIFIER CIRCUIT

U.S. PATENTS CITED

Robert H. Dennard, Field-Effect Transistor Memory, 1968, U.S. Pat. No. 3,387,286.

Robert F. Harland, MOS One Transistor Cell RAM Having Divided and Balanced Bit Lines, Coupled by Regenerative Flip-Flop Sense Amplifiers, and Balanced Access Circuitry, 1977, U.S. Pat. No. 4,045,783.

Toshiaki Kirihata et al., Destructive Read Architecture for Dynamic Random Access Memories, 2004, U.S. Pat. No. 6,829,682.

FIELD OF THE INVENTION

This invention relates to integrated memory circuits and more particularly to high-density dynamic memory with compact sense amplifier circuitry.

BACKGROUND OF THE INVENTION

Semiconductor memories can be generally divided into two broad categories based on their volatility, or ability to retain data in the absence of supplied power. Volatile memory can be sub-classified based on the method of data retention used, dynamic or static. Dynamic volatile memory, known as Dynamic Random Access Memory (DRAM), requires periodic refreshing to retain data, while static volatile memory, known as Static Random-Access Memory (SRAM), does not. Non-volatile memory can be sub-classified based on whether the memory is writable: memory that can be written to only once versus memory that can be rewritten. One-time write memories include mask programmable and fuse programmable Read-Only Memory (ROM), and rewritable memories include Erasable Programmable Read-Only Memory (EPROM), Electrically Erasable Programmable Read-Only Memory (EEPROM), flash memory, and Ferroelectric Random-Access Memory (FeRAM), among others. The different types of semiconductor memory are summarized in J. M. Rabaey et al., *Digital Integrated Circuits. A Design Perspective*. Prentice Hall, Upper Saddle River, N.J., 2nd edition, 2003.

DRAM is the most dense, and therefore least expensive per bit, of all types of semiconductor memory that can be written during system operation. It offers good read and write performance, but consumes a fairly substantial amount of power compared with other memories. SRAM is more expensive per bit than DRAM, but offers the best performance of rewritable semiconductor memory. Non-volatile memories, in general, have reasonably high density, and often have similar read performance to DRAM; however, most presently available rewritable non-volatile memories have poor write performance. Furthermore, they are only capable of a limited number of rewrites, which prevents them from competing with DRAM as an inexpensive, well-performing memory for computing systems.

A wealth of further information on the various types of semiconductor memories and their operation can be found in K. Itoh, *VLSI Memory Chip Design*. Springer-Verlag, Berlin, 2001.

DRAM

DRAMs are inexpensive in terms of cost per bit. At the same time, DRAMs offer relatively low latency access combined with a good throughput rate. These characteristics are the result of a design philosophy that focuses first on creating a memory that is as dense as possible, and then on encapsulating it in an architecture that maximizes performance.

The salient characteristic of a modern DRAM is the use of the one transistor and one capacitor (1T1C or sometimes just 1T) unit storage cell. This cell was disclosed by Robert H. Dennard of IBM in 1968. The 1T1C cell can be designed in an extremely small area on an integrated circuit, allowing a large number of cells on a single chip, so that the resulting product has a low production cost per bit. The challenge in using the 1T1C cell is operating it in a large scale array with good performance. This requires an elaborate organization scheme that is described later in this background.

The 1T1C cell stores a bit by representing that bit as a charge stored across the cell capacitor. A positive charge represents a logic "high," while a negative charge represents a logic "low." The access transistor functions as a switch, controlled by the wordline, that couples the cell capacitor to the bitline.

To store a bit in a cell, a "high" voltage level is applied to the wordline connected to the desired cell. At the same time, the voltage level to be stored is applied to the bitline that is connected to the desired cell. With the access transistor active, the cell capacitor is charged from the bitline with a "high" or "low" charge. The access transistor is then deactivated and the stored charge remains on the cell capacitor.

To read a bit from the cell, the capacitive bitline is left floating at a precharge voltage (usually Vdd/2), and the access transistor is activated. If a "high" voltage level is stored in the cell, then the bitline voltage will increase; if a "low" voltage level is stored, then the bitline voltage will decrease. Either way, a sense amplifier on the bitline detects the change in voltage and amplifies this voltage to a full logic "high" or "low" level. Because the access transistor is still open when this amplification occurs, the cell that was read is restored to its full original logic level. Once this restoration is complete, the access transistor is deactivated, and a new operation can begin.

The extent to which the bitline voltage increases or decreases during a read operation is determined by capacitive charge sharing. Both the bitline and memory cell have a fixed capacitance, with the bitline capacitance normally being five to ten times larger than that of the memory cell. When the access transistor is activated for a read operation, the charge on the cell capacitor is shared with the charge on the bitline to generate a change in bitline voltage given by $dV=(Vcell-Vpre)\times(Cs\div(Cb+Cs))$, where dV is the change in bitline voltage due to charge sharing, Vcell is the stored cell voltage, Vpre is the bitline precharge voltage, Cs is the cell capacitance, and Cb is the bitline capacitance. Because the bitline capacitance is much larger than the cell capacitance, the value of dV is normally relatively small. For that reason, the sense amplifier has to be very sensitive to small changes in voltage in order to adequately detect stored logic levels.

DRAM operation is thoroughly described in B. Keeth and R. J. Baker, *DRAM Circuit Design. A Tutorial*, IEEE Press, Piscataway, N.J., 2001.

DRAM Architecture and Organization

Modern DRAMs are partitioned into core and periphery regions. The core region consists of the memory cells along with supporting circuits that are repeated at a frequency equal to an integer multiple of that of the bitlines or wordlines. The periphery region consists of control circuitry, I/O pads, data buffers, synchronization circuitry, voltage conversion circuitry, and other circuits whose functions relate directly to the specific architecture in which they are employed. The core regions are sub-organized into an array region, which contains the memory cells themselves, and another region that contains sense amplifiers, hierarchical wordline drivers and bitline twist strips.

The memory array is a two-dimensional array of memory cells, with wordlines running parallel in one dimension (normally referred to as the "X" dimension) and bitlines running parallel in the other dimension (normally referred to as the "Y" dimension), such that wordlines and bitlines are perpendicular to each other. Due to this organization, the group of cells connected to a single wordline is often referred to as a "row," and the group of cells connected to a single bitline or a bitline pair is often referred to as a "column."

There are two bitline structures used in modern DRAMs. Those are the open bitline structure, originally introduced in Karl Stein et al., *Storage array and sense/refresh circuit for single-transistor memory cells*, IEEE Journal of Solid-State Circuits, SC-7(5):336-340, October 1972, and the folded bitline structure, disclosed by Robert F. Harland in 1977. Every commercial DRAM produced today uses one of these two bitline organizations, or else a direct variant or a hybrid of the two.

The open bitline organization, also referred to as "cross-point" organization, is a simple scheme in which a memory cell resides at every intersection of a wordline and a bitline. In an open bitline structure, each bitline within an array is independent of its neighbors and is connected to a separate sense amplifier. The folded bitline organization, on the other hand, is a scheme in which a memory cell resides only at every second intersection between a wordline and a bitline. Each pair of adjacent bitlines in a folded array is connected to a single sense amplifier.

The memory core is organized hierarchically, with sub-arrays as the base elements. The capacitance of a bitline needs to be minimized so that a sufficiently strong signal is developed during read. Furthermore, the wordline and bitline capacitance both need to be minimized so as to minimize power consumption and improve performance. To accomplish this, the memory array is broken into sub-arrays that each have their own supporting circuitry. A typical sub-array in a 1-Gb DRAM with folded bitlines has 256 cells per bitline and 512 cells per "sub-wordline", with a few additional of both types of line to provide static redundancy and to avoid photolithographic problems. The term "sub-wordline" is used to describe wordline segments so as to distinguish them from global wordlines that run across multiple sub-arrays.

Mated with each sub-array is a block of sense amplifiers, and, when a hierarchical wordline scheme is used, a local row decoder block. Each of these sub-array units with their surrounding logic is repeated numerous times in two dimensions to form a block of the core. Each core block then has associated column decode, global row decode, and control logic involved in controlling data flow and moving data from the core to the periphery.

Sensing Techniques

One of the most defining aspects of a DRAM design is the sensing technique used to read (and restore) data from a memory cell. This section briefly presents the most relevant sensing techniques.

The earliest DRAMs used three-transistor memory cells with separate bitlines for reading and writing, and employed single-ended (non-differential) sense amplifiers, as described in W. M. Regitz and J. A. Karp, *Three-transistor-cell 1024-bit 500-ns MOS RAM*, IEEE Journal of Solid-State Circuits, SC-5(5):181-186, October 1970. The sense amplifier design that supported the two-bitline columns consisted of four transistors: one for precharging the "write" bitline, a column enable transistor, a bias transistor, and a sensing transistor whose gate connected to the "read" bitline. When a cell was selected and a signal was transferred to the "read" bitline, the sense transistor would drive a near zero current to an output pin to indicate a logic "high" or a 400-$\mu$A current to indicate a logic "low." Today, single-ended sensing is used very little, since it does not allow sufficient performance for most modern memories.

The most popular sensing technique in modern DRAMs is differential voltage sensing. The advantages of using differential sense amplifiers are that they are non-inverting, they reject common mode noise, they are insensitive to process variations, they are very sensitive to small signals, and they can operate very quickly. Furthermore, by using positive feedback in a differential amplifier, reading and restoring is merged into a single operation, and performance is improved.

Another sensing technique called "direct sensing" separates the read (output) lines from the write (input) lines, as described in K. Itoh, *VLSI Memory Chip Design*, Springer-Verlag, Berlin, 2001. It uses a conventional differential voltage sense amplifier to detect the stored cell voltage; however, it decouples the I/O lines from the bitlines, allowing significantly faster sensing at the expense of additional area.

Another sensing technique called "time multiplexed sensing" allows performance to be sacrificed for a substantial gain in density and some improvement in noise rejection. In time multiplexed sensing, one differential sense amplifier services multiple bitline pairs. Each pair is sensed (and restored) in sequence, and the result of each sense operation is transferred out of the memory core via a global bitline or data bus. This sharing of a single sense amplifier between a group of bitlines significantly reduces the sense amplifier area in a DRAM, which in turn reduces the area of the DRAM chip as a whole. This technique is described in T. Hasegawa et al., *An experimental DRAM with a NAND-structured cell*, IEEE Journal of Solid-State Circuits, 28(11):1099-1104, November 1993.

SUMMARY OF THE INVENTION

The invention comprises a dynamic memory device with compact sense amplifier circuit for storing and retrieving data, and a method for storing and retrieving data using said device.

The dynamic memory device comprises:
(a) an array of dynamic memory cells arranged in columns and rows, wherein each column corresponds to a bitline and each row corresponds to a wordline, and which is organized in a plurality of regular sub-arrays;
(b) a plurality of column read/write circuits, wherein each column read/write circuit comprises a single-transistor sense amplifier and supporting circuitry that enables input from and output to a corresponding plurality of bitlines;
(c) an architecture that enables said column read/write circuits to function as intended while maintaining a high density of components within the memory device.

The method for storing and retrieving data comprises:
(a) a method for reading stored data from the memory device using a single-transistor sense amplifier and supporting circuitry to detect the stored data and then transfer said data out of the device;
(b) a method for writing stored data to the memory device in such a way as to enable a subsequent read operation;
(c) a method for refreshing stored data in the memory device to compensate for degradation of dynamic data over time;

(d) a reference scheme that enables the aforementioned reading, writing, and refreshing operations
(e) a method for sensing stored data using digital signal processing, where levels can be sensed with an analog to digital converter with greater resolution than required for simply resolving the discrete levels of stored data, and where crosstalk between bitlines can be cancelled to yield the sensed data.

The memory device has higher density but lower speed than conventional dynamic memories, making it suitable for applications that require a low cost memory but have flexible speed requirements. Such applications include, but are not limited to, file memory for tertiary storage in a computer system, portable solid-state disk, and low-latency standalone network devices.

The following drawings and description provide further details about the specific nature of the invention.

BRIEF DESCRIPTION OF THE DRAWINGS

In the accompanying drawings:

FIG. 12A is a mathematical matrix that contains values for 20% coupling between adjacent bitlines, with coupling falling off exponentially with distance;

FIG. 12B is a mathematical matrix that is equal to the inverse of the matrix of FIG. 12A, and is used to cancel coupling noise represented by the matrix of FIG. 12A.

DETAILED DESCRIPTION OF THE INVENTION

Figure 1A:
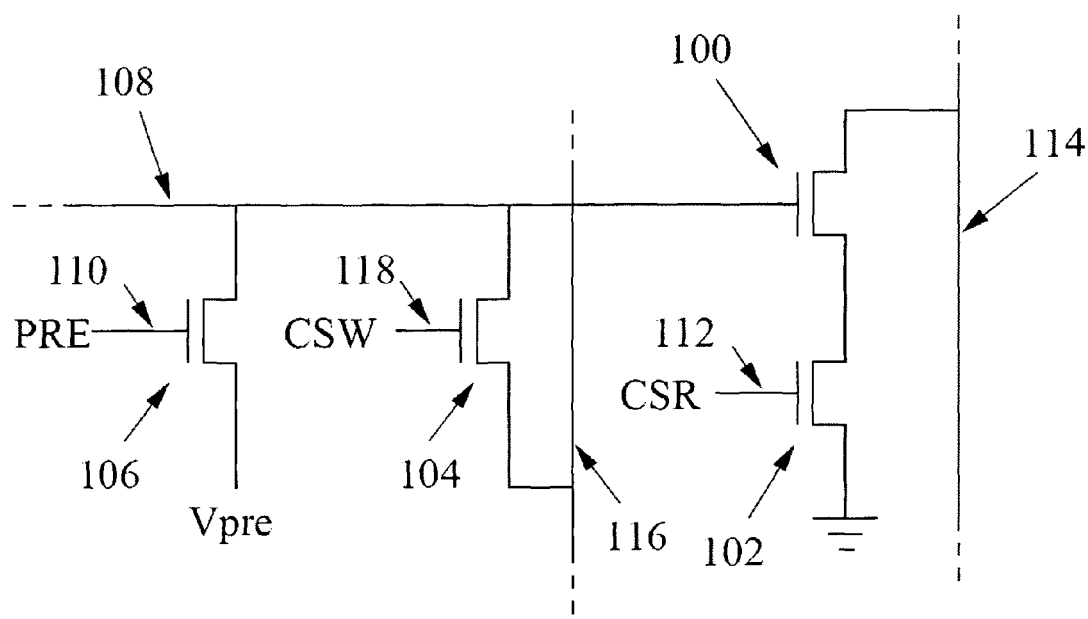
FIG. 1A is a schematic diagram of a four-transistor sensing circuit that includes one single-transistor sense amplifier and three supporting transistors for precharge, reading, and writing, in accordance with the present invention.

The present invention is a dynamic memory device that comprises a new architecture, circuitry, and method for data storage and retrieval. The device provides a higher-density memory compared with conventional DRAM. It is enabled by the use of very small, simple sense amplifiers, as well as an open bitline array organization. A number of novel techniques are presented for coping with reduced-complexity sense amplifiers, as well as for improving the economics of the memory. Such techniques include reducing bitline length, adding separate read and write select lines, using a two-pass write operation to reduce coupling noise, allowing for serial I/O, and employing a unique reference scheme.

General Operation

Within the memory array are typical dynamic storage cells that operate identically to the cells in DRAM. When a sub-row of data, which constitutes a single block unit of sequential data, is to be read from a sub-array, the sub-wordline corresponding to that sub-row is activated. All of the cells in that sub-row transfer their data to their respective columns. Unlike DRAM, however, the column data is not detected, amplified, and latched by digital sense amplifiers. Rather, the column data remains dynamically stored on the bitlines as an analog voltage. Each column is then read and amplified in sequence with dedicated sense amplifiers that feature single transistor read amplifiers.

Each sense amplifier along a single row is connected to a common data bus. This bus carries an amplified analog representation of the column data (in the form of a current) from the array to the periphery, one column at a time. In the peripheral circuitry for each bank is a data converter that converts the analog signal into a digital representation of the original stored data.

In order for a data converter to interpret the analog signal data, reference values are required. These references are read from additional columns in the active sub-row, in the same way as the rest of the data. The references are read and sampled before any other columns are read. They are sampled and compared to the analog read value from each column to determine which value was stored. The read data is then transferred to a cache buffer that stores it for restore and I/O purposes.

Once the entire sub-row has been read, the data is rewritten to the sub-row sequentially while the sub-row remains active. After the entire sub-row has been restored, including the stored reference values, it is deactivated. Writing to the memory occurs in a similar fashion, except the data that populates the cache buffer comes from external I/O rather than from the array.

Array Organization

An open bitline array organization is employed, providing three major advantages over a folded bitline array. First, the open bitline organization is the most dense possible organization for a cell array. Second, the present invention has numerous characteristics that make the noise immunity of a folded array either unnecessary or not useful. These characteristics include reduced voltage swing on read, time multiplexed sensing, the ability to have shorter than typical bitlines, and the use of single-ended sense amplifiers. Finally, recent research, including M. Redeker, B. F. Cockburn, and D. G. Elliott. *An investigation into crosstalk noise in DRAM structures*, in Proceedings of the 2002 IEEE International Workshop on Memory Technology, Design and Testing, pages 123-129, July 2002, as well as T. Takahashi et al., *A multigigabit DRAM technology with $6F^2$ open-bitline cell, distributed overdriven sensing, and stacked-flash fuse*, IEEE Journal of Solid-State Circuits, 36(11):1721-1727, November 2001, indicates that as DRAMs scale to smaller sizes, the advantages of a folded bitline scheme are reduced.

In general, the present invention is compatible with any array architecture, possibly with minor modifications. However, an open bitline organization provides very high density, making it particularly suitable for use with the present invention.

Single-Transistor Sense Amplifier and Supporting Circuitry

A key differentiating aspect of the present invention is the sensing scheme, which uses a single transistor to sense data on a bitline. Such an amplifier provides a great density improvement and flexibility in array design because it leads to a very compact layout and can exactly sense any voltage that appears on a bitline. It also presents a number of design challenges, in terms of noise management and core organization, that the present invention also addresses as described in the sections below.

The characteristics that make a good single transistor read amplifier are high gain, high input impedance, large valid input swing, small layout area, and good noise immunity. To attain these characteristics, a single transistor amplifier can be configured as a common source or common drain transconductance amplifier, with the transistor gate connected to a bitline as the input to the amplifier.

The present invention uses a single-transistor common source transconductance amplifier (CSTA) with an NMOS transistor, which provides high gain and allows a full input swing between the threshold and supply voltage of the NMOS device. The NMOS source is grounded and the current through the transistor is read on the drain side. The drain can be loaded with a passive or active load, or can have zero (or near zero) impedance. Some loading is unavoidable due to a resistive data bus and the presence of a global sense amplifier on the bus.

The sizing of the amplifier transistor is process-dependent. It must be sized such that it has a high enough gain to satisfy signal margin requirements, and such that process variations in length and width have sufficiently small effect.

One preferred embodiment of the single-transistor amplifier and supporting circuitry is shown in FIG. 1A. FIG. 1A shows an NMOS CSTA 100 with a column select read (CSR) transistor 102 at the amplifier source. The other transistors are the write transistor 104 and precharge transistor 106, and their specific purposes are described in the following sections.

Figure 1B:
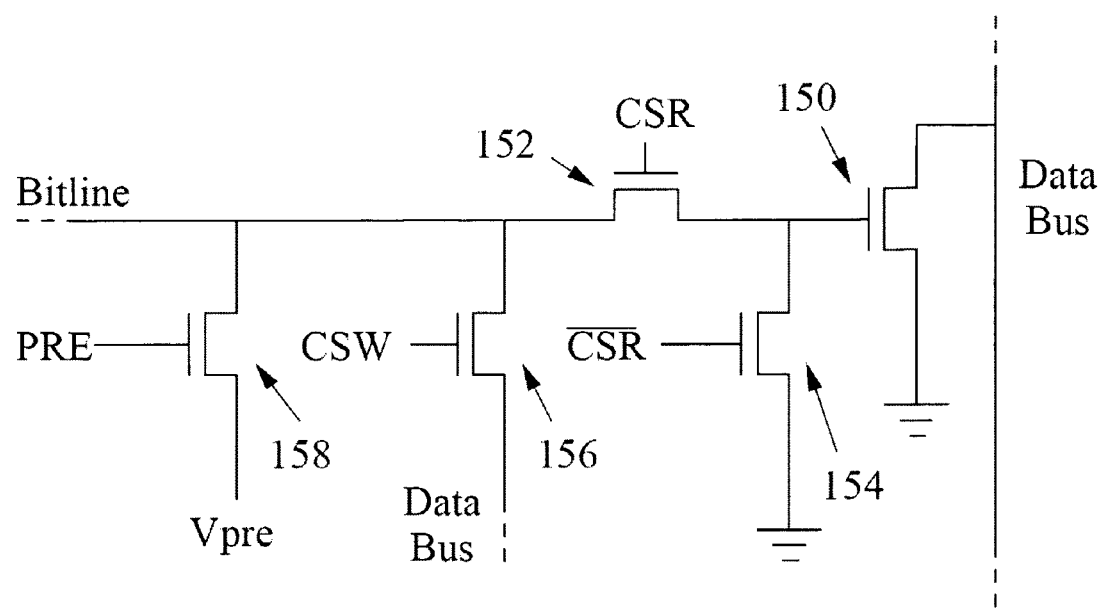
FIG. 1B is a schematic diagram of a five-transistor sensing circuit that includes one single-transistor sense amplifier and four supporting transistors for precharge, reading, and writing, in accordance with the present invention.

A second preferred embodiment of the single-transistor amplifier and supporting circuitry is shown in FIG. 1B. FIG. 1B shows an NMOS CSTA 150 with two column select read (CSR) transistors 152, 154, one write transistor 156, and one precharge transistor 158. This embodiment uses an extra transistor, but eliminates the need for a CSR transistor connected to the source of the sensing transistor.

Both preferred embodiments of the single-transistor amplifier and supporting circuitry are functionally equivalent for the purposes of the remaining detailed description of the present invention. Therefore, the preferred embodiment depicted in FIG. 1A is used in any specific examples in the remainder of the detailed description.

Read Operation

Figure 2:
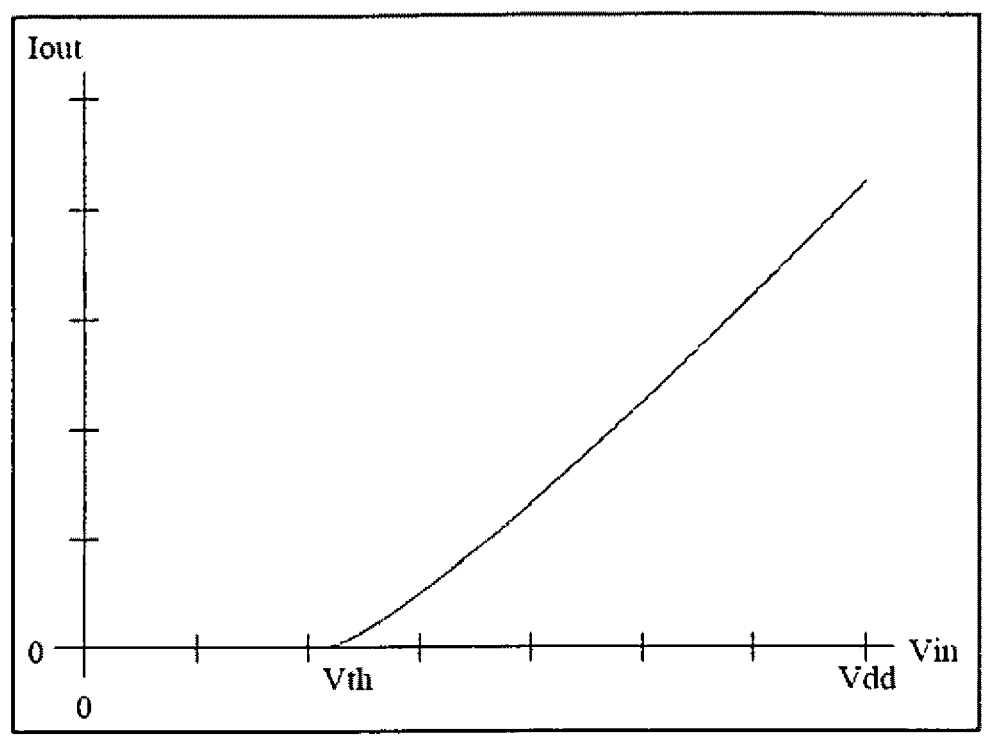
FIG. 2 is a graphical representation of the input/output characteristic of the sense amplifier of FIG. 1A.

A read operation begins by precharging the bitline 108, which is done by activating the PRE control line 110. The precharge voltage is set to a carefully controlled amplifier bias voltage, which does not need be Vdd/2. The purpose of this bias is to place the amplifier appropriately in its useful operating range. A single-transistor sense amplifier can not distinguish bitline voltages around and below the threshold voltage (Vth) of the sense transistor because there is little to no output distinction between different input values in that region, as shown in FIG. 2. Therefore, the bitline needs to be biased such that its voltage remains above Vth after charge sharing has occurred. There is in fact an optimal bias point that allows the maximum possible amplifier output swing for a given cell ratio. Interestingly, this bias point is not necessarily in the exact center of the amplifier's useful input range. The optimal bias point is described later in this detailed description.

With the bitline precharged, a sub-wordline is activated and the stored voltage in the selected memory cell is mixed with the bitline bias voltage through capacitive charge sharing, as would occur in a conventional DRAM. The resulting voltage is maintained on the floating bitline while all bitlines in the sub-row are accessed sequentially. After a small amount of time, the sense amplifier that is connected to the bitline in question is selected by activating the CSR input 112. This activates the amplifier, producing a current on the data bus 114 determined by the amplifier I/O characteristic. The current for a stored '1' will be much larger than the current for a stored '0', particularly in an array with a low ratio of cell capacitance to bitline capacitance.

The data bus current passes through a primary bus amplifier, and is then converted to a valid digital level by a data converter located at the edge of the memory core. The process of converting the current to a valid digital level is done by comparing the analog data value to a sampled reference value. The result of that comparison is the reconstructed data, and a cache buffer is used to retain the data as necessary for restore and I/O operations, described later in this detailed description.

Though this scheme is complex, it makes reading with the sense amplifier configuration of FIG. 1A possible. It also has the potential to reduce power consumption under specific circumstances. During a read, the bitlines do not make full voltage swings. If a sub-row is read and does not need to be restored (in the event of a read-write operation), then no power is consumed by an unnecessary restore operation.

There is a challenge in using this read scheme that arises from leaving data floating on the bitlines for a short amount of time. The problem is with leakage. Leakage mechanisms in the array cause the voltage left floating on the combined cell and bitline capacitance to slowly decay. This signal degradation must be considered in an implementation in two ways. Most importantly, the sub-row length must be kept short enough that the column that leaks for the longest amount of time while the sub-row is active (i.e. the last column to be read) stays within noise tolerances. Secondly, there is an area penalty for enforcing a maximum length on the sub-rows, because more sub-wordline drivers are required in the core. An implementation must make a tradeoff between area penalty and noise margins that suits the requirements of a particular design.

Write and Restore Operations

Writing and restoring are essentially the same operation in the present invention. In both cases, data is transferred from a cache buffer into the array. The only difference is whether the cache buffer data was generated from a read operation or by an I/O operation.

For either a write or a restore, the data from the cache buffer is written sequentially back into the array by way of a data bus. For a write, a sub-row is first activated; for a restore, the sub-row is already active from the read operation. Data values are written one column at a time. For each column that is written, the data value for that column is placed on the data bus 116 shown in FIG. 1A. In the preferred embodiment, the input data bus is the same wire as the output data bus, but it may be also be implemented as a separate wire. Then the column select write signal (CSW) 118 is activated for that column. The data is stored as a dynamic charge on the combined bitline and cell capacitance. CSW is brought low, and the charge remains on the floating bitline until all columns have been written. Once all of data has been written, the sub-wordline is deactivated and data is stored in the cells.

Figure 3:
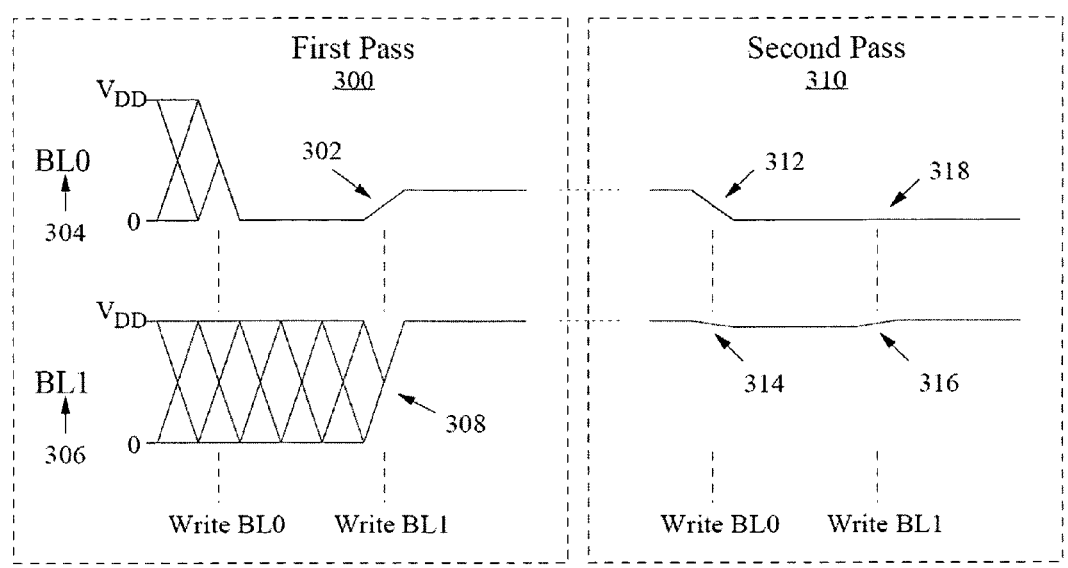
FIG. 3 is a graphical representation of the signals on two adjacent bitlines during a write operation of the present invention.

The practice of leaving bitlines floating while others are written introduces a noise problem in the array. The floating bitlines are susceptible to noise from capacitive coupling to other bitlines that are being actively written. This coupling noise problem is most significant between adjacent bitlines. In FIG. 3, the "First Pass" timing diagram 300 shows how coupling causes noise 302 on bitline BL0 304 when an adjacent bitline BL1 306 is written and experiences a voltage transition 308. This noise can substantially reduce the available signal margins for a subsequent read operation.

The solution to the write coupling problem is to make two write passes when writing a sub-row. The first time a row is written, significant coupling noise will appear. This is because some bitlines will make large swings, and the amount of coupling noise on one bitline is proportional to the swing on an adjacent bitline. In FIG. 3, the "Second Pass" timing diagram 310 shows how bitlines experience much smaller swings 312, 314, 316 on a second write pass, and coupling noise is virtually eliminated 318. This two-pass scheme is made possible by the relaxed performance requirements of the present invention. It is possible to trade off performance for an improvement in noise margins. It is worth noting that there is not much additional power consumption for the extra write, because the bitlines experience very small swings on the second pass.

Bitline leakage presents a problem during write or restore, just as it does during read. Since bitlines are left floating while others are written, they are subject to signal degradation due to leakage. Similarly as for read operations, the designer must consider this leakage when determining sub-row length, refresh times, and noise margins.

For this write scheme to be extended to support multilevel memory, only one change is required. A digital-to-analog converter must be used to convert the digital data in the cache into analog levels to be stored in the array. Because the write operation is essentially an analog procedure, no other architectural changes would need to be made.

Core Architecture

Figure 4:
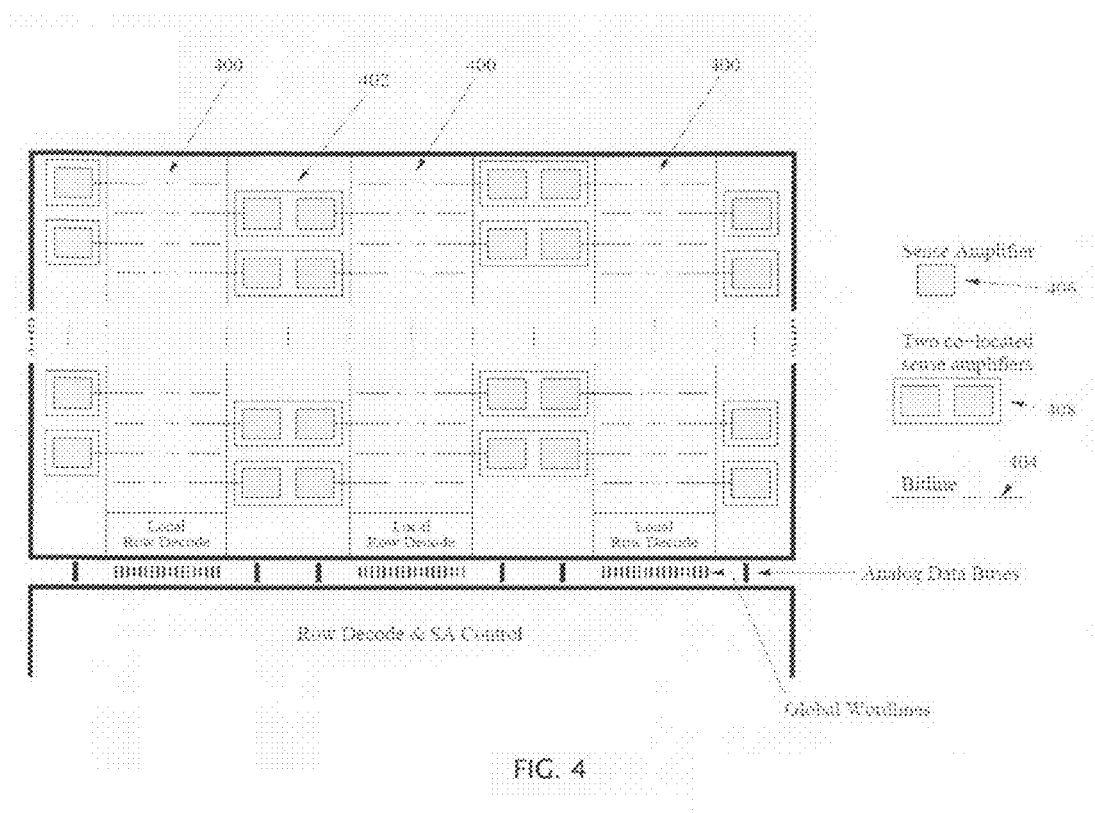
FIG. 4 is a diagram of the organization and bitline multidivision scheme for the present invention.

FIG. 4 shows the multi-division scheme for the architecture of the present invention. This multi-division scheme allows the sub-arrays 400 to be as dense as possible with an open bitline organization, while also allowing double pitch sense amplifiers 402. Each bitline 404 connects to a sense amplifier 406, but each sense amplifier can be laid out in the pitch of two bitlines. This is plenty of space for the minimal sense amplifiers used in the present invention. Sense amplifiers are placed in pairs 408 so that each bitline has its own sense amplifier, but no transistors can be shared between adjacent amplifiers in the preferred embodiments shown in FIG. 1A or FIG. 1B. For wordline multi-division, a simple scheme that minimizes area is appropriate, performance not being a priority. Wordline multi-division remains necessary, however, so that sub-wordlines can be kept short enough to minimize the effects of leakage during read and write operations.

Routing in the core must be done a bit differently in the present invention than it would be done in DRAM. There are fewer signals to route between each sub-array because the sense amplifier requires far fewer control signals. However, the need for separate read and write column select lines presents a routing challenge, since the higher levels of metal that are needed to route these signals cannot have as fine a pitch as the bitlines.

Figure 5:
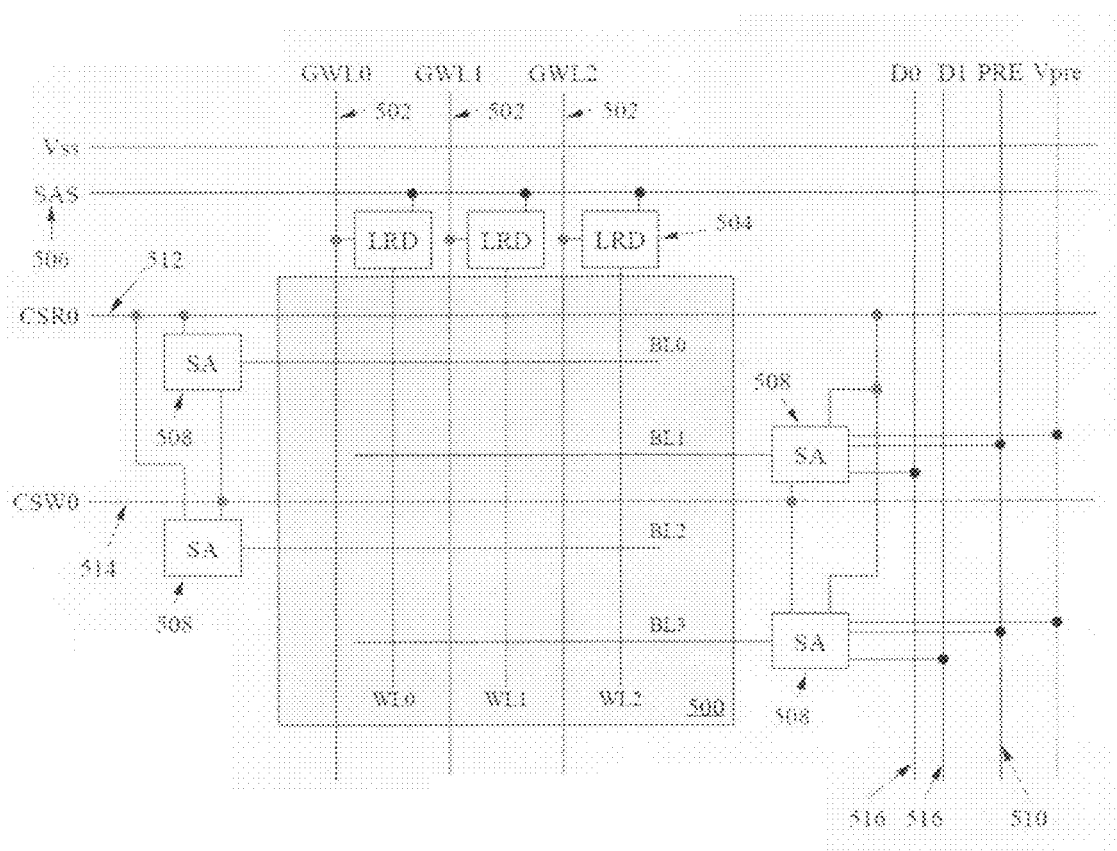
FIG. 5 is a diagram indicating the signal routing scheme for the present invention.

FIG. 5 shows the preferred core routing for a single sub-array 500. The sub-array unit is repeated in the horizontal and vertical directions to form a core region. The global wordline (GWL) signals 502 activate local row decoders (LRD) 504 when combined with the sub-array select (SAS) signal 506. The sense amplifiers 508 are controlled by the precharge (PRE) 510, column select read (CSR) 512, and column select write (CSW) 514 signals. The data buses (D0 and D1) 516 are responsible for transporting data from the sense amplifiers out of the core.

The routing in FIG. 5 requires a DRAM process that supports quadruple-pitch read and write wires. This means that for each sub-array, each CSR and CSW signal connects to two double-pitch sense amplifiers. For this to be possible, two data buses are needed, one for each sense amplifier that shares a single CSR and CSW signal. Otherwise there would be data bus contention between the two sense amplifiers. For any process, the pitch of column select lines should be made as fine as possible, and then the minimum number of data buses required to support those column select lines should be used.

A particular process might have tungsten bitlines and silicided polysilicon wordlines. GWL lines could be routed with the first aluminum layer, along with the data buses and precharge control lines. For the CSR and CSW signal then, the second aluminum layer could be used and these lines could be alternated at that layer's minimum allowed pitch. Alternatively, if a third layer of aluminum is available, then CSR and CSW lines can run parallel on separate layers. Either way, the number of data bus lines needed to support the CSR and CSW lines is equal to the ceiling of the CSR or CSW pitch divided by the sense amplifier pitch.

Memory Architecture

Figure 6:
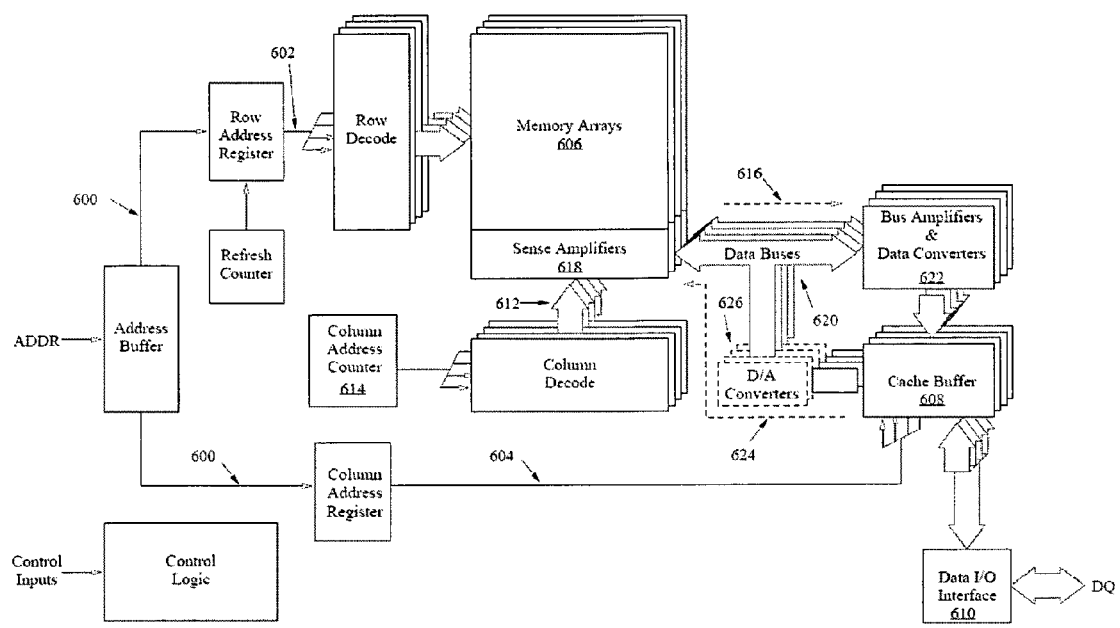
FIG. 6 is a block diagram of the overall architecture of the present invention.

A block diagram of the overall architecture is shown in FIG. 6, with control circuitry omitted. A four bank memory is depicted, although any number of banks can be used. In the address path 600, separate row addresses 602 and column addresses 604 are required, or the column address can be eliminated completely for block-only access. To conserve pins on a packaged chip, addresses can be passed in serially rather than as a single word. The row address is decoded and applied to the memory arrays 606 in the same way as it would be in a DRAM. The column address, if optionally used, follows a different path. Because the core memory arrays only support serial block access, there is no need to pass a column address into the core. Instead, the column address is used to access the cache buffer 608, which provides data to the synchronous data I/O interface 610 during a read operation. Column select signals 612 in the memory core are controlled by a column address counter 614, which selects each column one after the other until an entire row is read.

The read datapath 616 begins in the sense amplifiers 618, where data is sensed and placed on a data bus 620 in the form of a quantity of current. The data is forwarded through a data bus amplifier to a data converter 622, which converts the analog data to a valid digital data level. Recovered data bits are then stored in the cache buffer for the purposes of I/O and restoration. The write datapath 624 bypasses the data bus amplifier and data converter block to write back to the memory core from the cache. For multilevel operation, a digital-to-analog converter (DAC) 626 is required to convert digital data into multiple-valued analog data for storage in the core.

Reference Scheme

The present invention includes a reference scheme that provides good noise performance and minimizes the effects of cell leakage. This reference scheme is possible because of the flexibility gained by placing the analog-to-digital conversion process in the peripheral region rather than local to each sense amplifier (as in conventional DRAMs).

In this reference scheme, extra "reference bitlines" are placed in each sub-array. These reference bitlines contain only reference cells rather than data cells. One reference bitline is required for each valid stored data value; for instance, in a two-level memory there are two reference bitlines. Every time a row is written, the active cells on these extra bitlines are written with the set of valid stored data levels. In a two-level memory then, 0 V would be written to one cell and Vdd would be written to the other. These extra writes are always in the same sequence, so the same reference cells always hold the same value. Once a write operation is complete, this set of reference values remains stored in the extra cells, just like regular data.

During a read operation, the reference cells on the active sub-row are read first, in sequence. The current that they effect in the sense amplifier is sampled by a data converter, and held in either analog or digital form for the remainder of the read operation. Once all reference currents have been stored, the actual data in the row is read and converted to digital data. This is achieved by comparing the read data to each sampled reference value; the reference value that most closely matches the read data value represents the reconstructed bit. This differs from conventional DRAMs, which compare stored data to intermediate reference voltages that lie between valid data values.

The strength of this scheme is its ability to minimize the effects of cell leakage. Dynamic memory cells lose their contents gradually over the time between refresh operations. By storing references in cells in the same way data is stored, the references experience the same time-dependent decay as data. Thus, when the data and references are read back out and compared, the data more closely matches the correct reference.

Figure 7A:
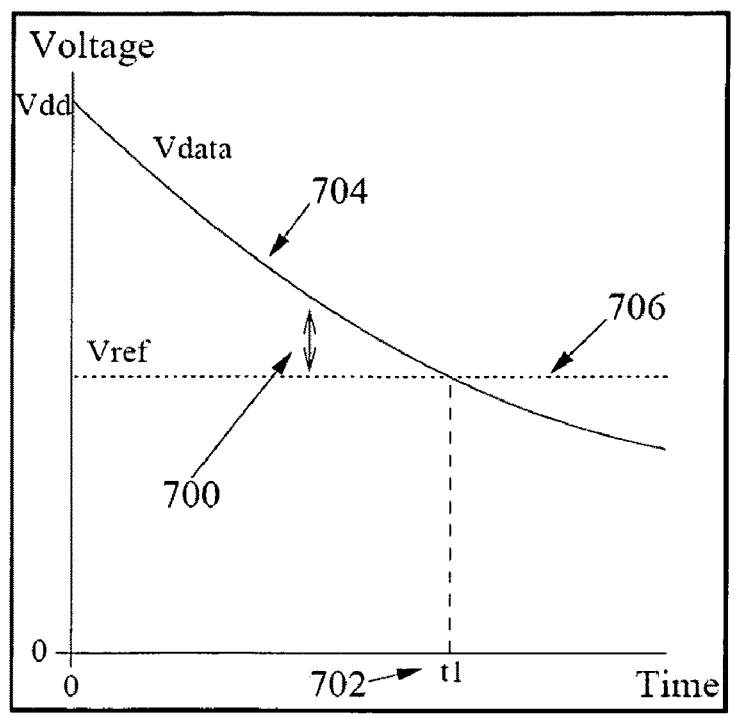
FIG. 7A is a graphical representation of the signal margin characteristic of the reference scheme of a conventional dynamic memory.
Figure 7B:
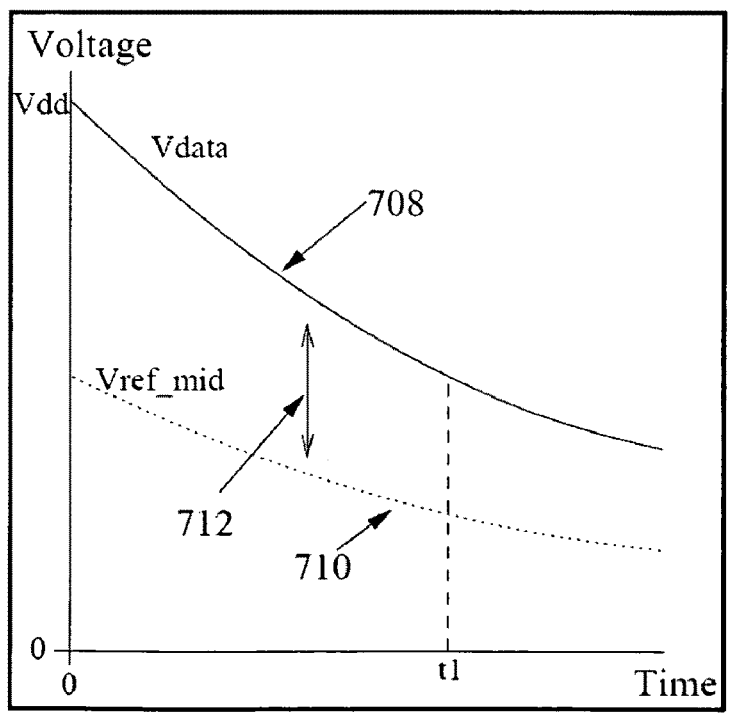
FIG. 7B is a graphical representation of the signal margin characteristic of the reference scheme of the present invention.

FIG. 7A and FIG. 7B show how this reference scheme can improve the signal margins when cell leakage is present. In FIG. 7A and FIG. 7B, a two-level memory is assumed. It is also assumed that leakage currents pull cells toward 0 V. In practice, the voltage toward which cells drift is influenced by the combined effect of all cell leakage mechanisms. In particular, subthreshold leakage pulls the cell toward the bitline voltage, PN junction leakage pulls toward the bulk voltage, and gate oxide leakage pulls toward the wordline voltage. The relative weighting of each of these leakage mechanisms, and hence the voltage toward which cells drift, is implementation dependent.

The conventional reference scheme used in DRAMs is shown in FIG. 7A. As time elapses, the signal margin 700 for sensing a stored Vdd level decays rapidly, and at time t1 702 the stored voltage 704 has decayed below the reference voltage 706 and it cannot be read correctly. In the reference scheme of the present invention, depicted in FIG. 7B, the stored voltage 708 decays as it does it the conventional scheme. However, the stored Vdd reference value also decays, ideally at the same rate as the stored data value. The dotted line labeled Vref_mid 710 shows the midpoint between the two stored references (0 and Vdd) as each of them drifts. This midpoint represents the decision threshold between a "high" and a "low" data level. The resulting signal margin 712 is larger than for a conventional reference scheme.

Another advantage of this reference scheme is that no intermediate reference voltages need to be generated anywhere in the memory. The reference voltages are equal to the data voltages. This does not help in the case of two-level memory, since a precharge voltage must be generated anyway, but in multilevel memories this can be a significant advantage.

There are some challenges associated with using this reference scheme. For it to be effective, all cells must experience similar amounts of leakage. This means that process control must be very strict so that variations in leakage between cells are within a tolerable range. Otherwise, noise margins can be substantially degraded. Process control must also be very strict for the sense amplifiers. Because the stored references are read with a sense amplifier in the same way as data, significant variation in a reference sense amplifier will cause a reduction in noise margins. At device testing, if variation tolerances are not met, then redundant rows or columns would need to be swapped in to replace offending cells and sense amplifiers.

Another requirement needed to ensure that the cells experience similar amounts of leakage is that inactive bitlines must all be precharged to the same level at all times, otherwise subthreshold leakage will vary between cells. This is standard practice in most commercial DRAMs. The control circuitry must make sure that if some bitlines must float for a certain period of time during inactivity, they float for as short a time as possible.

Figure 8A:
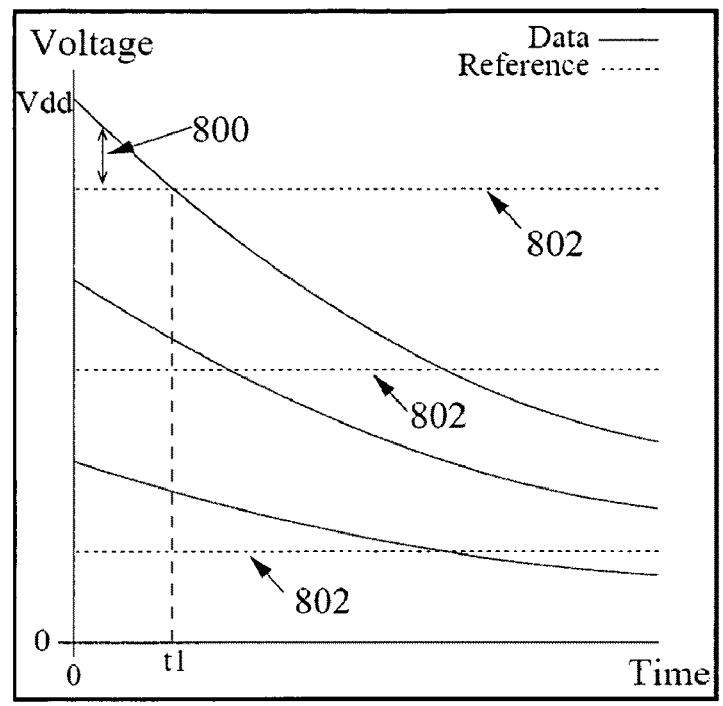
FIG. 8A is a graphical representation of the signal margin characteristic of the reference scheme of a conventional multilevel dynamic memory.
Figure 8B:
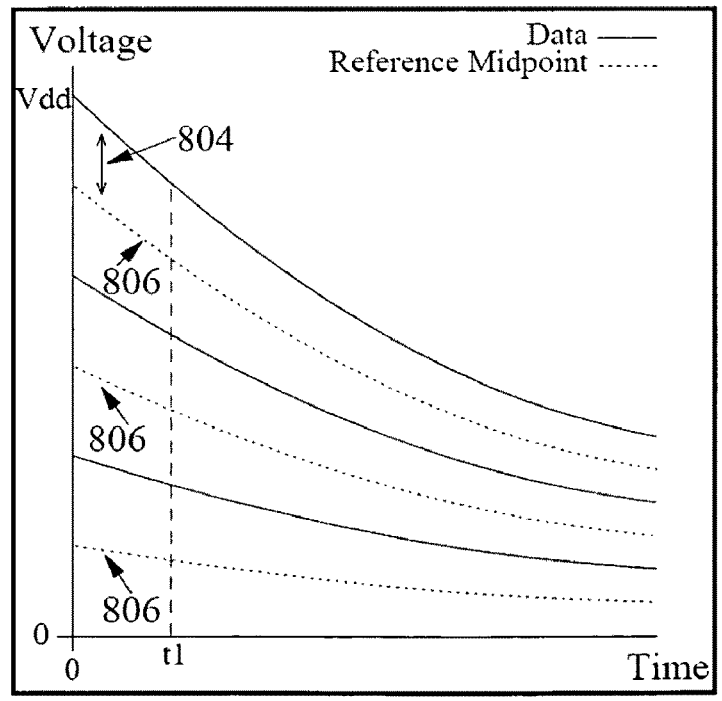
FIG. 8B is a graphical representation of the signal margin characteristic of the reference scheme of the present invention when using multilevel data storage.

This reference scheme is also very effective in a multilevel memory. As shown in FIG. 8A and FIG. 8B, signal margins 800, 804 are larger for a much longer period of time when using this scheme with multiple stored levels. Note that the reference curves 802, 806 in FIG. 8A and FIG. 8B are not actual stored values; rather, they are the midpoints between pairs of stored reference values.

Data Bus Amplifiers

During a read operation, data bus amplifiers are responsible for driving the common data buses that are shared within blocks of sense amplifiers. Data buses require specific conditions to allow the sense amplifiers to properly drive them, and these conditions must be provided by data bus amplifiers. A constant voltage must be held on the data bus so that each sense amplifier experiences the same bias conditions, and sufficient current must be supplied to each data bus. The data bus amplifiers must generate these conditions, and prepare data for use as the input to a data converter. When a read operation begins and a sense amplifier has been selected to drive a data bus, the data bus amplifier must transfer the analog bus current to a data converter. One amplifier is required per data bus.

Figure 9:
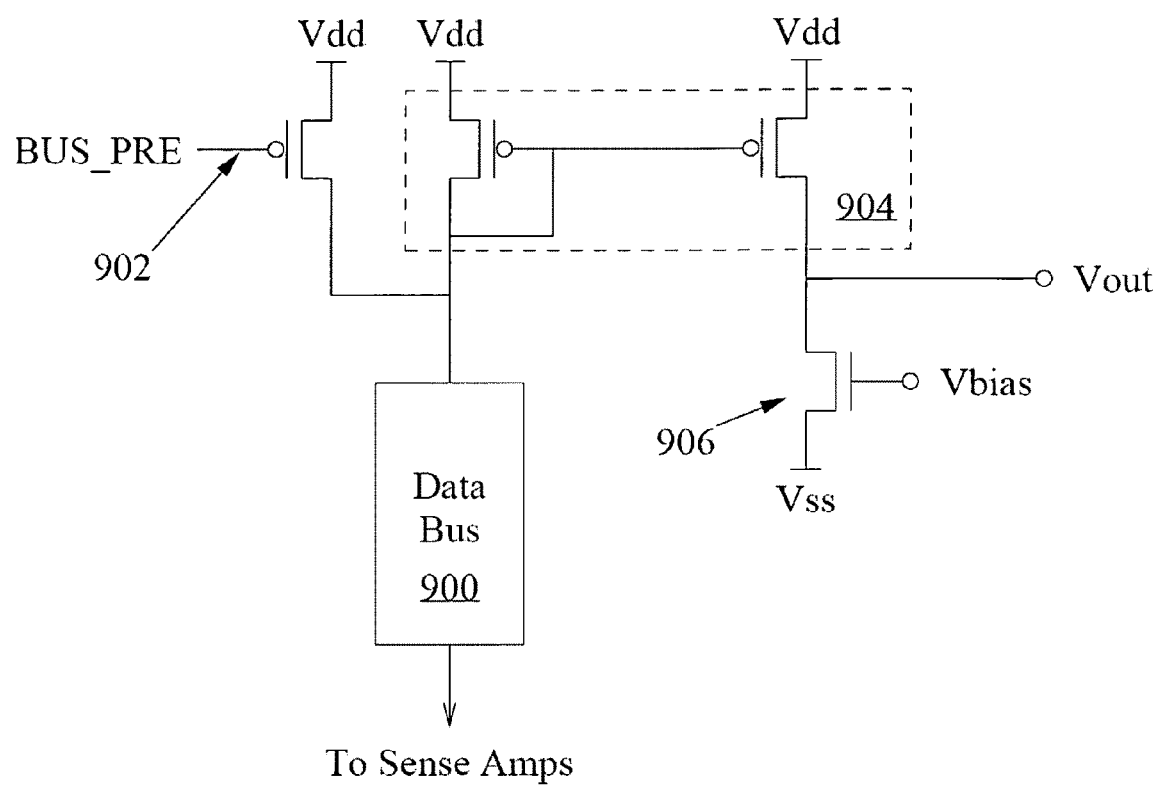
FIG. 9 is a schematic diagram of a current mirror data bus amplifier.

FIG. 9 shows a current mirror amplifier circuit that provides appropriate current and voltage conditions on the data bus 900. It also isolates the data bus from the output driver so that the input load of subsequent circuitry is unimportant. The bus precharge (BUS_PRE) signal 902 is used before each amplifier operation to pull the bus to Vdd. The PMOS current mirror 904 can not pull the data bus strongly to Vdd on its own, so precharging the bus substantially reduces worst case sensing time. The Vbias transistor 906 converts the amplifier output current to an output voltage.

Data Converters

Data conversion circuitry is required to translate the analog read signal output of a bus amplifier into a valid digital logic level. This is essentially an analog-to-digital conversion process. A converter must sample the reference values when they are first read from the array, and then compare subsequent data values to the references to determine the logic level to which those values correspond. One data converter unit is required for every data bus that will be active at one time.

In a multilevel memory, data conversion occurs in the same fashion, except more references are stored, and more comparisons are required. The data converters accommodate these requirements either with parallelism or time-multiplexing of the conversion operation. Additionally, a digital-to-analog converter is needed for write and restore operations.

Data conversion circuitry can be used to sample sensed data at a greater resolution than required for simply resolving discrete levels of stored data, and the resulting digital information can be filtered using digital signal processing to cancel coupling noise that arises from the memory array. This application is discussed later in this detailed description.

Cache Buffer

The cache buffer stores data before write operations and after read operations. SRAM is a very suitable technology for this buffer because of its relatively high density, which minimizes its area requirement, and its good performance, which allows a high external I/O rate. However, other types of memory could also be used. The buffer only needs to be a type of memory that can outperform the memory core, and it should take up as little chip area as possible.

Each cache unit must have sufficient capacity to hold a sub-row of data, and one unit is required per data converter. The cache needs to have sequential bit access for read, write, and I/O operations. It also may be desirable to use a dual-ported cache to allow I/O operations simultaneously with restore operations. Regardless, a basic cache is sufficient for successful operation of the memory.

Density Improvement Compared to Conventional DRAM

The area of a dynamic memory chip, whether it is a conventional DRAM or the present invention, can be calculated as follows.

A sub-array of cells without any decode or sensing circuitry has an area given by: Aarray=Nb×Pb×Nw×Pw, where Nb and Nw are the number of bitlines and wordlines in a sub-array, respectively, and Pb and Pw are the bitline and wordline pitches, respectively.

A core unit, defined as a basic sub-array with supporting sense amplifier and local row decode strips, has an area of Acore_unit=(Nb×Pb+Hlrd)×(Nw×Pw+Wsa) where Hlrd is the height (in the direction of the wordlines) of a local row decoder, and Wsa is the width (in the direction of the bitlines) of a sense amplifier, including I/O routing and column access devices. Also, any area occupied by bitline twist regions is included in the sense amplifier width value.

The area of the memory chip is then:
Achip=Nbanks×Ncore_units_per_bank×Acore_unit+Aperiphery,
where Nbanks is the number of banks in the chip, Ncore_units_per_bank is the number of core units per bank, and Aperiphery is the area occupied by peripheral circuitry, including the main row and column decode blocks, sensing control circuitry, I/O pads, and other circuits for tasks such as synchronization and voltage conversion. This equation ignores array redundancy, which is assumed to have a limited influence on the overall area comparison between conventional DRAM and the present invention.

Implemented in a 0.13-micron technology, a typical 1-Gb conventional DRAM has an area of approximately 0.232e+09 square microns, while one theoretical implementation of the present invention, having 256 cells per bitline, has an area of approximately 0.178e+09 square microns, which is approximately 77% of the size of the DRAM with the same capacity. Note that this analysis does not include the application higher-resolution data converters for coupling noise cancellation.

The area of any implementation of the present invention is dependent on various choices that can be made during implementation. These types of choices are common in integrated circuit design. However, one choice that is specific to the present invention is the number of cells per bitline. In the present invention, the number of cells per bitline can be adjusted to affect noise margins to make them more suitable for the technology being used for implementation. Table 1 shows three examples of how area is affected for different choices of the number of cells per bitline. The area is compared to conventional DRAM using a unit called F, which represents the minimum feature size of any technology (specified as ½ of the pitch of bitlines in the memory array), as a base unit for area calculation.

TABLE 1

Theoretical Area of the Present Invention for Different Bitline Lengths

| Cells per bitline in the present invention | Approximate area of the present invention measured in $F^2$ | Approximate ratio of area of the present invention to DRAM |
|---|---|---|
| 256 | 10.56 | 77.1% |
| 128 | 11.09 | 80.8% |
| 64 | 12.15 | 88.6% |

Operational Characteristics

Figure 10:
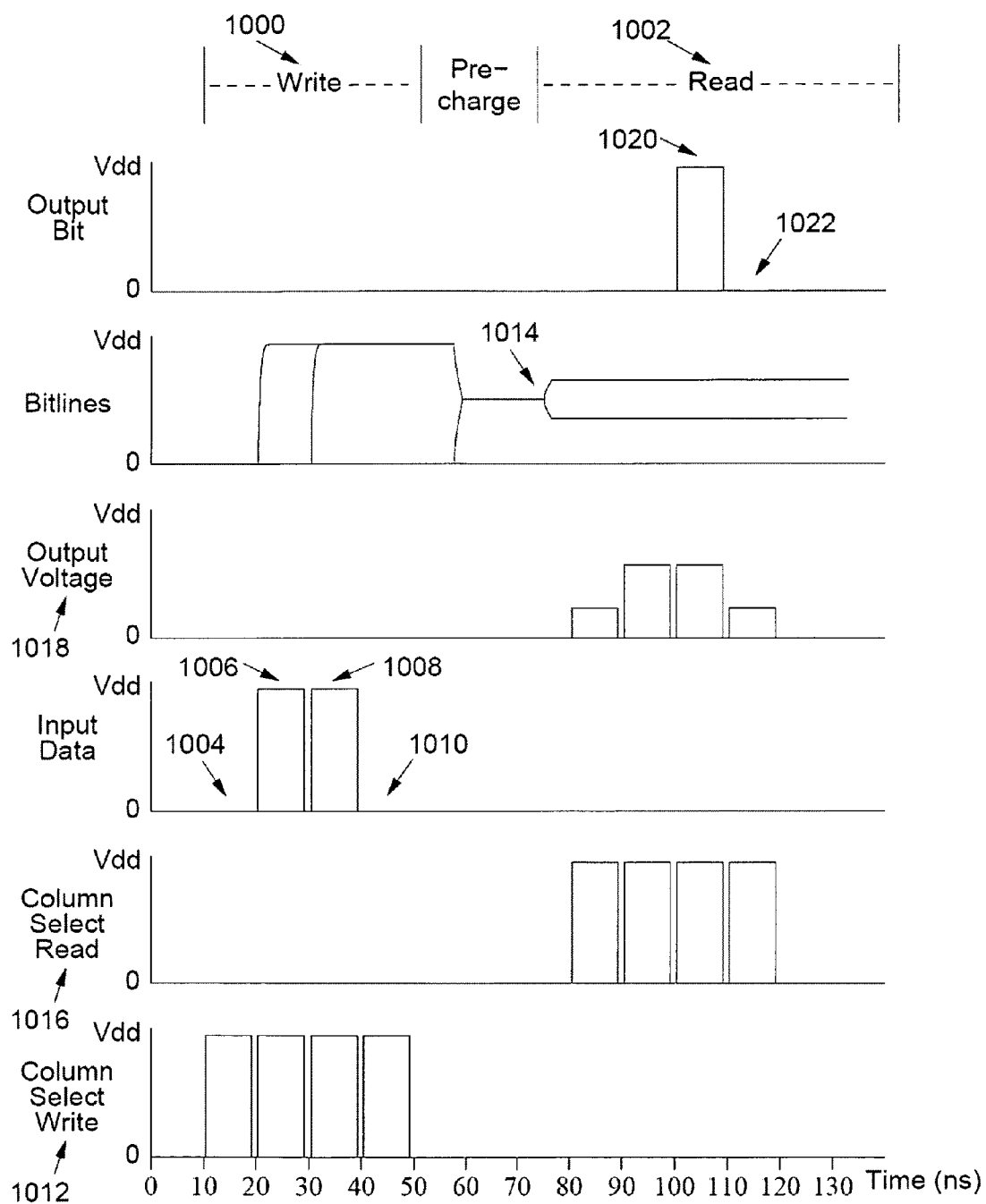
FIG. 10 is a diagram indicating the functional behavior of major signals in the present invention.

FIG. 10 summarizes the functional operation of the architecture of the present invention. FIG. 10 shows a write operation 1000 followed by a read operation 1002 for four cells: two reference cells and two data cells. The first reference cell is written with a '0' 1004, and the second is written with a '1' 1006. The data cells are opposite, written with a '1' 1008 first and a '0' 1010 second. Note that the timing shown in FIG. 10 is arbitrary. The writes occur at 10, 20, 30, and 40 ns in the simulation, indicated by the sequential rising and falling of the four column select write (CSW) signals 1012. The subsequent read begins at 75 ns with wordline activation 1014. As the four column select read (CSR) signals 1016 are asserted, the voltage output of the data bus sense amplifier for the row being sensed changes 1018. The correct data output is observed in the output signal with a '1' being read at 100 ns 1020 and a '0' being read at 110 ns 1022.

Bitline Biasing

Any precharge voltage can legitimately be chosen to bias the sense amplifiers. However, certain bias voltages will lead to better noise margins. The goal when precharging the bitlines is to bias the sense amplifier so as to provide the largest noise margins while keeping the sense amplifier within its valid operating range under worst-case conditions.

Optimal biasing is accomplished by biasing the sense amplifiers as close to Vdd/2 as possible, while ensuring that the bitline voltage stays within the valid operating region of the sense amplifiers. It is necessary to bias the amplifiers as close to Vdd/2 as possible because of capacitive coupling within the array. As the precharge moves farther away from Vdd/2, the bitline swing becomes much larger for reading one value and smaller for the other (i.e. more swing for a '0' and less for a '1'). Since the reference value stays fixed, there will be a much larger signal degradation for a small-swing bitline that is adjacent to several large-swing bitlines than there would be in the converse case. This leads to a problematic asymmetry in worst case noise margins.

The optimal bias point is dependent on the sense amplifier I/O characteristic and the bitline capacitance.

To find the optimal bias point, first the cell ratio (the ratio of bitline capacitance to cell capacitance) of the array is determined. The more accurately the cell ratio can be determined, the better the noise performance that can be achieved. Next, the lower bound for the valid operating region of an amplifier is found based on amplifier simulation. The lower bound must be the worst case lower bound (i.e. the lower bound for a slow amplifier model at the lowest allowable operating temperature), so that the amplifier will still perform well under these conditions. Finally, it is verified that the bitline signal for the given cell ratio is well within the valid input range of the amplifier. If the bitline signal is not primarily within that range, then the amplifier is not being used optimally and the bias should be increased.

Given the values of cell ratio and lower bound, the optimal bias point is:

$$V\text{bias\_opt} = \max\{(V\text{lower\_bound} \times (1 + C_s/C_b)), V_{dd}/2\},$$

where Vlower_bound is the lower bound of the sense amplifier input range, and Cs and Cb are the cell and bitline capacitance, respectively. This equation calculates the bias point by setting the lowest possible bitline voltage during a read operation equal to the sense amplifier's lower bound. The bias point is the precharge voltage that will produce the lower bound voltage when a '0' is read, unless that voltage is lower than Vdd/2, in which case a precharge of Vdd/2 is optimal.

Multilevel Operation

Very few architectural modifications are required to support multilevel data. This is attributable to the analog nature of both the sense amplifiers and the read, write and restore operations. Array organization, bitline biasing, references, and other aspects of the present invention are fundamentally analog, and therefore do not need to be changed.

Some changes are necessary, however. To store the multiple bits per cell after they have been read, a larger capacity cache buffer is needed. The required cache buffer size is $\log_2 N$ times larger than for two-level storage, where N is the number of levels per cell. Digital-to-analog converters (DACs) must be added to the write path. This adds some area overhead and design complexity, but otherwise has little impact on the architecture. Also, additional reference bitlines are required in each sub-array for the increased number of reference levels.

Noise margins are affected in a similar way to how they are affected in conventional DRAM. The use of N levels of storage per cell reduces the stored charge by N−1, effectively reducing noise margins by the same amount.

Figure 11:
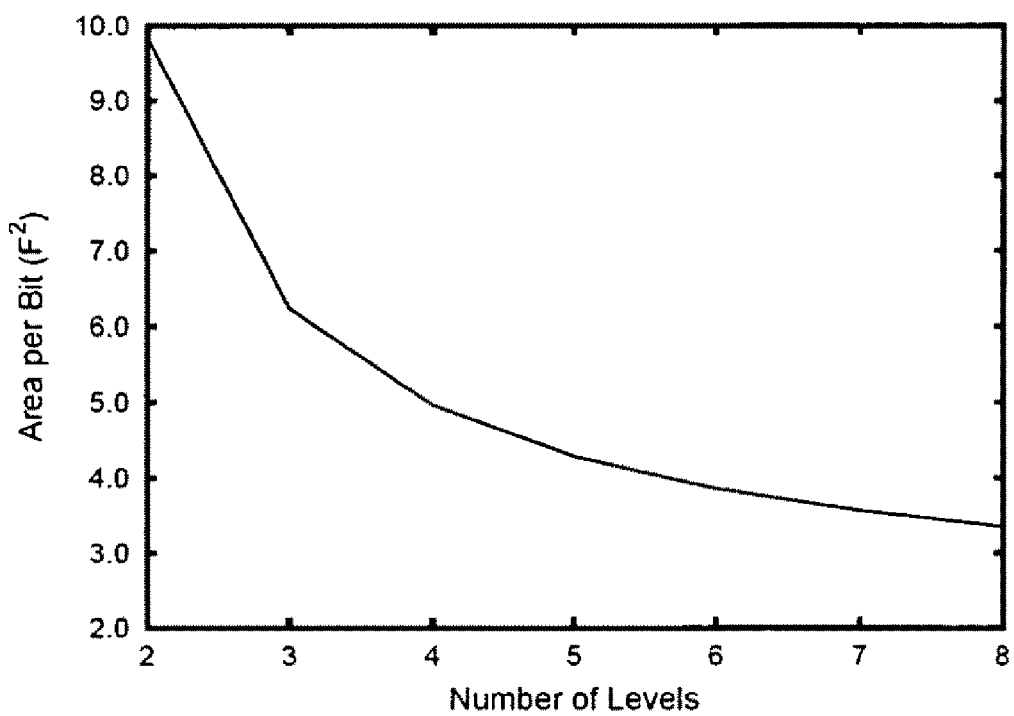
FIG. 11 is a graphical representation of the relationship between area per bit and number of levels per cell in the present invention when using multilevel data storage.

FIG. 11 shows the approximate area per bit, in terms of minimum feature size (F), versus number of stored levels for a multilevel implementation of the present invention with 256 cells per bitline and 512 cells per sub-wordline.

Coupling Noise Cancellation

Capacitive coupling within the memory array can be a very large noise contributor in many technologies for an implementation of the present invention. The two-pass write scheme of the present invention eliminates most of the coupling noise during a write operation, but coupling during a read operation still generates a great deal of noise.

Capacitive coupling noise can be reduced or even eliminated by performing digital signal processing on read data, through the use of analog-to-digital converters (ADCs) with greater resolution than required for simply resolving the discrete levels of stored data. A coupling matrix can be calculated, either statically based on estimated coupling noise, or dynamically based on measured coupling noise from the array. Digitized read data can then be multiplied by the inverse of the coupling matrix to effectively cancel out coupling noise, resulting in a much more accurate estimate of stored data from the array.

FIG. 12A shows an example coupling matrix with 20% coupling between adjacent bitlines, and coupling falling off exponentially with distance. In FIG. 12A, the rows represent five bitlines, and the columns represent the same five bitlines in the opposite order from the rows. The value in the matrix for a pair of bitlines indicates the percentage of signal that is coupled from the bitline for that row to the bitline for that column.

FIG. 12B shows the inverse matrix of the one in FIG. 12A. It is apparent that terms fall to zero quickly with distance from the diagonal, so only a few significant terms in each row need to be used to obtain sufficient accuracy when digitally multiplying the read data by the inverse of the coupling matrix.

The implementation of the coupling matrix and its multiplication can be relatively simple. Most terms can be ignored because the magnitude of coupling from other bitlines within the array drops off so quickly with distance. A simple three-tap finite impulse response (FIR) filter would suffice to multiply all non-zero matrix coefficients in the example matrix of FIG. 12B.

This technique can be applied to either two-level or multi-level storage. A very compact ADC design is required to minimize the area impact of the ADC. Also, the ADC must be able to perform quickly enough to convert each analog data sample during a sequential read operation. If these requirements are satisfied, the coupling noise cancellation method discussed here can greatly improve the signal-to-noise ratio during read operations, allowing a denser memory core and more levels of multilevel storage.

Observations

As will be apparent to those skilled in the art, various modifications and adaptations of the description above are possible without departing from the present invention, the scope of which is defined in the appended claims.

What is claimed is:

1. A circuit for reading and writing dynamic memory cells on a bitline, where the circuit is comprised of a sensing transistor, means for applying the signal from a bitline to the input of the sensing transistor, means for applying the output signal from the sensing transistor to a data bus, a read select transistor connected in series with the sensing transistor that is configured to enable or disable the sensing transistor, a write select transistor that, when enabled, couples a data input line to the bitline, and a precharge transistor that, when enabled, couples a precharge voltage input line to the bitline.

2. A circuit for reading and writing dynamic memory cells on a bitline, where the circuit is comprised of a sensing transistor, means for applying the signal on a bitline to the input of the sensing transistor, means for applying the output signal from the sensing transistor to a data bus, two read select transistors, where one read select transistor couples the input of the sensing transistor to ground when it is enabled and the other read select transistor couples the input of the sensing transistor to the bitline when it is enabled, and where only one of the read select transistors is enabled at any given time, a write select transistor that, when enabled, couples a data input line to the bitline, and a precharge transistor that, when enabled, couples a precharge voltage input line to the bitline.

* * * * *